(12) United States Patent
Cheng et al.

(10) Patent No.: US 10,056,474 B2
(45) Date of Patent: Aug. 21, 2018

(54) SEMICONDUCTOR STRUCTURES HAVING INCREASED CHANNEL STRAIN USING FIN RELEASE IN GATE REGIONS

(71) Applicant: INTERNATIONAL BUSINESS MACHINES CORPORATION, Armonk, NY (US)

(72) Inventors: Kangguo Cheng, Schenectady, NY (US); Bruce B. Doris, Slingerlands, NY (US); Ali Khakifirooz, Los Altos, CA (US); Darsen D. Lu, Westchester, NY (US); Alexander Reznicek, Troy, NY (US); Kern Rim, Westchester, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 165 days.

(21) Appl. No.: 14/953,519

(22) Filed: Nov. 30, 2015

(65) Prior Publication Data
US 2017/0053839 A1 Feb. 23, 2017

Related U.S. Application Data

(63) Continuation of application No. 14/830,789, filed on Aug. 20, 2015.

(51) Int. Cl.
| | |
|---|---|
| H01L 27/12 | (2006.01) |
| H01L 21/336 | (2006.01) |
| H01L 29/66 | (2006.01) |
| H01L 29/165 | (2006.01) |
| H01L 21/8238 | (2006.01) |
| H01L 21/84 | (2006.01) |
| H01L 29/78 | (2006.01) |

(Continued)

(52) U.S. Cl.
CPC .... H01L 29/6681 (2013.01); H01L 21/02532 (2013.01); H01L 21/0332 (2013.01);
(Continued)

(58) Field of Classification Search
CPC ............ H01L 29/165; H01L 29/66795; H01L 29/785; H01L 29/1054; H01L 29/7848;
(Continued)

(56) References Cited

U.S. PATENT DOCUMENTS 7,491,988 B2 * 2/2009 Tolchinsky ......... H01L 29/1054
257/192
8,513,125 B2 * 8/2013 Saracco ................. B82Y 10/00
216/11

(Continued)

OTHER PUBLICATIONS

Kangguo Cheng, et al., "Semiconductor Structures Having Increased Channel Strain Using Fin Release in Gate Regions", U.S. Appl. No. 14/830,789, filed Aug. 20, 2015.

(Continued)

*Primary Examiner* — Joseph C Nicely
*Assistant Examiner* — David Goodwin
(74) *Attorney, Agent, or Firm* — Cantor Colburn LLP; Vazken Alexanian (57) ABSTRACT

A method of introducing strain in a channel region of a FinFET device includes forming a fin structure on a substrate, the fin structure having a lower portion comprising a sacrificial layer and an upper portion comprising a strained semiconductor layer; and removing a portion of the sacrificial layer corresponding to a channel region of the FinFET device so as to release the upper portion of the fin structure from the substrate in the channel region.

13 Claims, 10 Drawing Sheets

(51) Int. Cl.
*H01L 21/02* (2006.01)
*H01L 21/033* (2006.01)
*H01L 21/32* (2006.01)
*H01L 21/324* (2006.01)
*H01L 29/10* (2006.01)
*H01L 29/161* (2006.01)

(52) U.S. Cl.
CPC ............ *H01L 21/32* (2013.01); *H01L 21/324* (2013.01); *H01L 21/823807* (2013.01); *H01L 21/823821* (2013.01); *H01L 21/845* (2013.01); *H01L 29/1033* (2013.01); *H01L 29/161* (2013.01); *H01L 29/165* (2013.01); *H01L 29/66795* (2013.01); *H01L 29/785* (2013.01); *H01L 29/7848* (2013.01); *H01L 29/7849* (2013.01)

(58) Field of Classification Search
CPC ............... H01L 21/845; H01L 29/0673; H01L 29/42392
See application file for complete search history.

(56) References Cited

U.S. PATENT DOCUMENTS

| | | | | |
|---|---|---|---|---|
| 2010/0295021 | A1* | 11/2010 | Chang | H01L 27/1203 257/24 |
| 2012/0091528 | A1* | 4/2012 | Chang | H01L 29/7848 257/347 |
| 2013/0270638 | A1* | 10/2013 | Adam | H01L 29/66795 257/347 |
| 2014/0103397 | A1* | 4/2014 | Pillarisetty | B82Y 10/00 257/192 |
| 2014/0210013 | A1* | 7/2014 | Kim | H01L 27/092 257/369 |
| 2015/0076514 | A1* | 3/2015 | Morin | H01L 29/7843 257/77 |
| 2015/0228755 | A1* | 8/2015 | Wei | H01L 29/6681 257/192 |
| 2015/0243784 | A1* | 8/2015 | Morin | H01L 29/7842 257/348 |
| 2016/0190317 | A1* | 6/2016 | Liu | H01L 29/7848 257/192 |

OTHER PUBLICATIONS

List of IBM Patents or Patent Applications Treated as Related; (Appendix P), Filed Feb. 16, 2016, 2 pages.

Kangguo Cheng et al., "Semiconductor Structures Having Increased Channel Strain Using Fin Release in Gate Regions", Related Application, U.S. Appl. No. 15/866,676, filed Jan. 10, 2018.

List of IBM Patents or Patent Applications Treated As Related; (Appendix P), Filed Mar. 26, 2018; pp. 1-2.

* cited by examiner

SEMICONDUCTOR STRUCTURES HAVING INCREASED CHANNEL STRAIN USING FIN RELEASE IN GATE REGIONS

DOMESTIC PRIORITY

This application is a continuation of U.S. Non-Provisional application Ser. No. 14/830,789, entitled "SEMICONDUCTOR STRUCTURES HAVING INCREASED CHANNEL STRAIN USING FIN RELEASE IN GATE REGIONS", filed Aug. 20, 2015, which is incorporated herein by reference in its entirety.

BACKGROUND

The present invention relates generally to semiconductor device manufacturing and, more particularly, to forming semiconductor structures having increased channel strain using fin release techniques in the gate regions.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type transistors (NFET and PFET) are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques. One of the more important indicators of potential device performance is the carrier mobility. There is a significant challenge with respect to keeping carrier mobility high in devices of deeply submicron generations.

The gain of an FET, usually defined by the transconductance ($g_m$), is proportional to the mobility (μ) of the majority carrier in the transistor channel. The current carrying capability, and hence the performance of an FET is proportional to the mobility of the majority carrier in the channel. The mobility of holes, which are the majority carriers in a PFET, and the mobility of electrons, which are the majority carriers in an NFET transistor, may be enhanced by applying an appropriate stress to the channel. Existing stress engineering methods greatly enhance circuit performance by increasing device drive current without increasing device size and device capacitance. For example, a tensile stress liner applied to an NFET transistor induces a longitudinal stress in the channel and enhances the electron mobility, while a compressive stress liner applied to a PFET transistor induces a compressive stress in the channel and enhances the hole mobility.

SUMMARY

In one aspect, a method of introducing strain in a channel region of a FinFET device includes forming a fin structure on a substrate, the fin structure having a lower portion comprising a sacrificial layer and an upper portion comprising a strained semiconductor layer; and removing a portion of the sacrificial layer corresponding to a channel region of the FinFET device so as to release the upper portion of the fin structure from the substrate in the channel region.

In another aspect, a method of forming a semiconductor device structure, includes patterning a hardmask layer to block an NFET region of a silicon-on-insulator (SOI) substrate; recessing an SOI layer in a PFET region of the SOI substrate; doping the recessed layer in the PFET region to form a sacrificial layer having an etch selectivity with respect to the SOI layer; forming a compressively strained silicon germanium (SiGe) layer over the sacrificial layer; removing the hardmask layer and forming one or more fins in the NFET region and one or more fins in the PFET region, wherein NFET fins comprise the SOI layer, and wherein PFET fins have a lower portion comprising the sacrificial layer and an upper portion comprising the compressively strained SiGe layer; and removing a portion of the sacrificial layer corresponding to a channel region of the one or more PFET fins so as to release the upper portion from the SOI substrate in the channel region.

In another aspect, a strained FinFET structure includes a lower fin material formed on a substrate, the lower fin material disposed at opposing ends of a channel region; an upper fin material formed on the lower fin material, the upper fin material comprising a strained semiconductor material, and wherein the lower fin material comprises a material that is etch selective with respect to the upper fin material; and wherein the channel region below the upper portion comprises a removed section of the lower fin material such that the upper fin material in the channel region is released from the substrate, thereby resulting in strain introduced throughout an entire height of the upper fin material in the channel region.

BRIEF DESCRIPTION OF THE DRAWINGS

Referring to the exemplary drawings wherein like elements are numbered alike in the several Figures:

FIGS. 1 through 10 are a series of cross sectional views of an exemplary embodiment of a method of forming a semiconductor structure having increased channel strain, in accordance with an exemplary embodiment, in which:

DETAILED DESCRIPTION

As transistor device pitch is scaled, conventional strain engineering techniques such as embedded stressors and stress liners (discussed above) lose their effectiveness. New and effective techniques are thus desired for maintaining channel strain.

Accordingly, disclosed herein is a method of generating channel strain within a FinFET device and resulting structure. As described in further detail below, embodiment herein use an embedded strain applied to a fin, which strain originates from outside the channel region using an embedded silicon germanium (SiGe) and/or embedded carbon doped silicon (Si:C) with 0.5-4% carbon content, for example. A bottom portion of the fin includes a sacrificial, highly n-doped layer that is subsequently removed in the channel layer, thereby releasing the channel portion of the fin from the underlying substrate, thereby creating strain in the channel region. The undercut fin may then optionally be filled with a dielectric or semiconductor fill material prior to subsequent gate processing.

Referring generally now to FIGS. 1 through 10, there is shown a series of cross sectional views of a method of forming a semiconductor structure having increased channel strain, in accordance with an exemplary embodiment. As particularly shown in FIG. 1, an exemplary starting wafer 100 is depicted as a silicon on insulator (SOI) substrate, and includes a bulk layer 102 (e.g. silicon), a buried oxide (BOX) layer 104 on the bulk layer 102, and an SOI layer 106 bonded to the BOX layer 104. As is known in the art, SOI wafers are an engineered composite wafer substrate that chipmakers can use as the starting material for fabricating integrated circuits (ICs). It is the substrate of choice for applications such as high-speed circuits, wireless and broadband communications for example.

Figure 1:
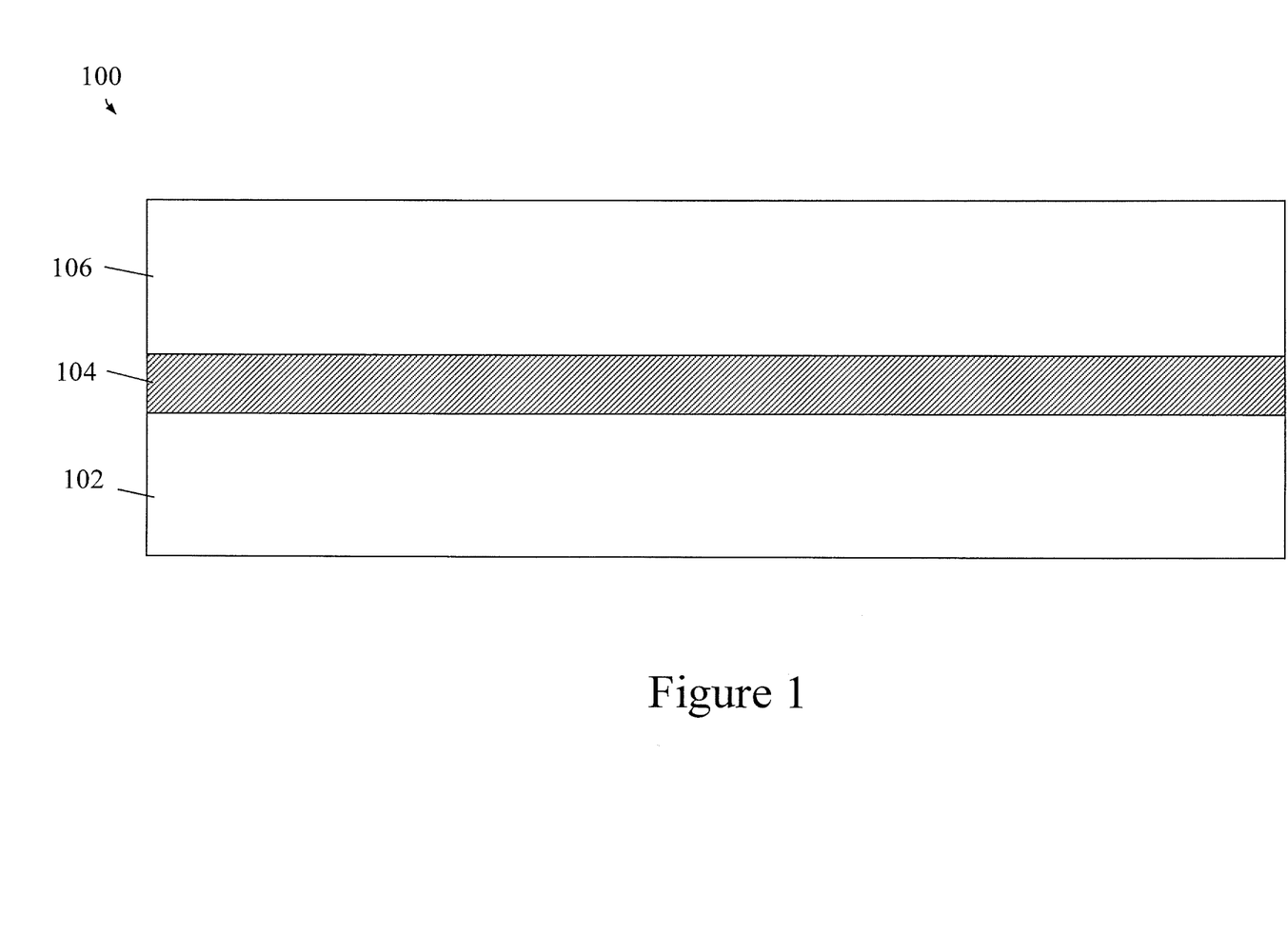
FIG. 1 illustrates an exemplary starting wafer including a silicon on insulator (SOI) substrate, having a bulk layer, a buried oxide layer on the bulk layer, and an SOI layer bonded to the BOX layer.
Figure 2:
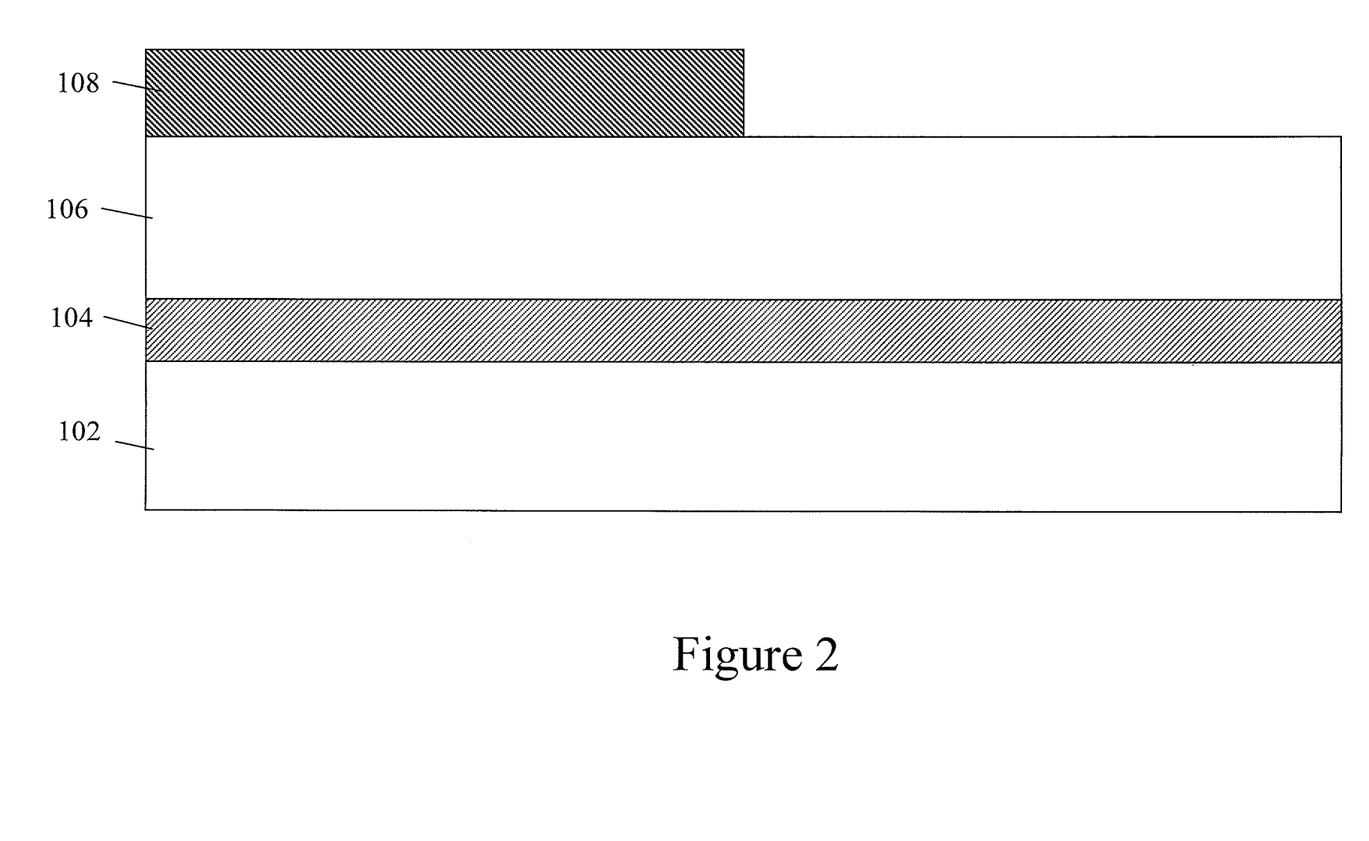
FIG. 2 illustrates a hardmask layer patterned over the SOI layer in preparation of a fin etching step to define both NFET fins and PFET fins within the SOI layer.
Figure 3:
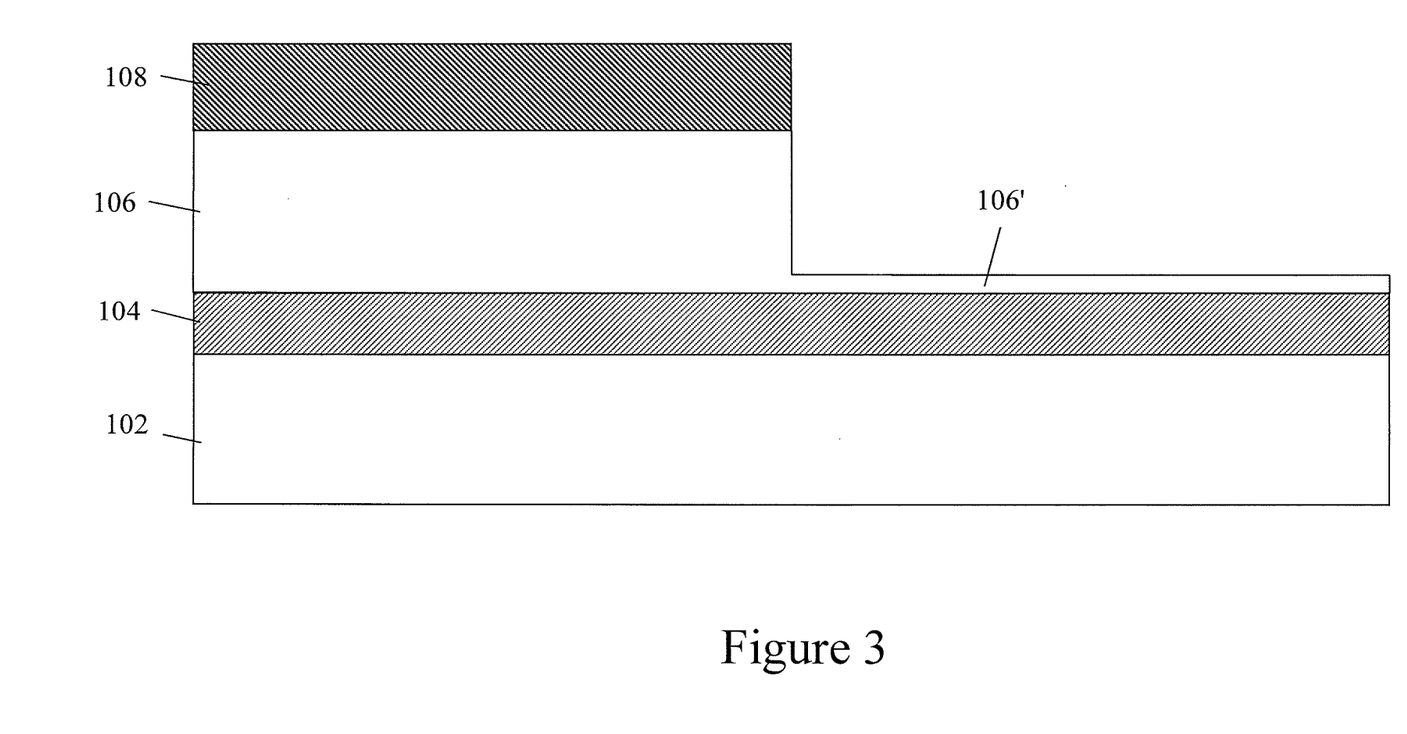
FIG. 3 illustrates a silicon recess of the exposed PFET regions of the SOI layer.

FIG. 2 illustrates a hardmask layer 108 (e.g., nitride) that is formed and patterned over the SOI layer 106 to block NFET regions of the SOI layer 106 and expose PFET regions. Then, as shown in FIG. 3, a silicon recess of the exposed PFET regions of the SOI layer 106 is performed so as to leave a thin silicon layer 106' remaining. The recess may be performed by a timed etch such that it does not completely remove the silicon and exposed the BOX layer 104. By way of example, where the thickness of the unetched SOI layer 106 is on the order of about 20-100 nanometers (nm), the thickness of the recessed silicon layer 106' may be on the order of about 5-10 nm.

Figure 4:
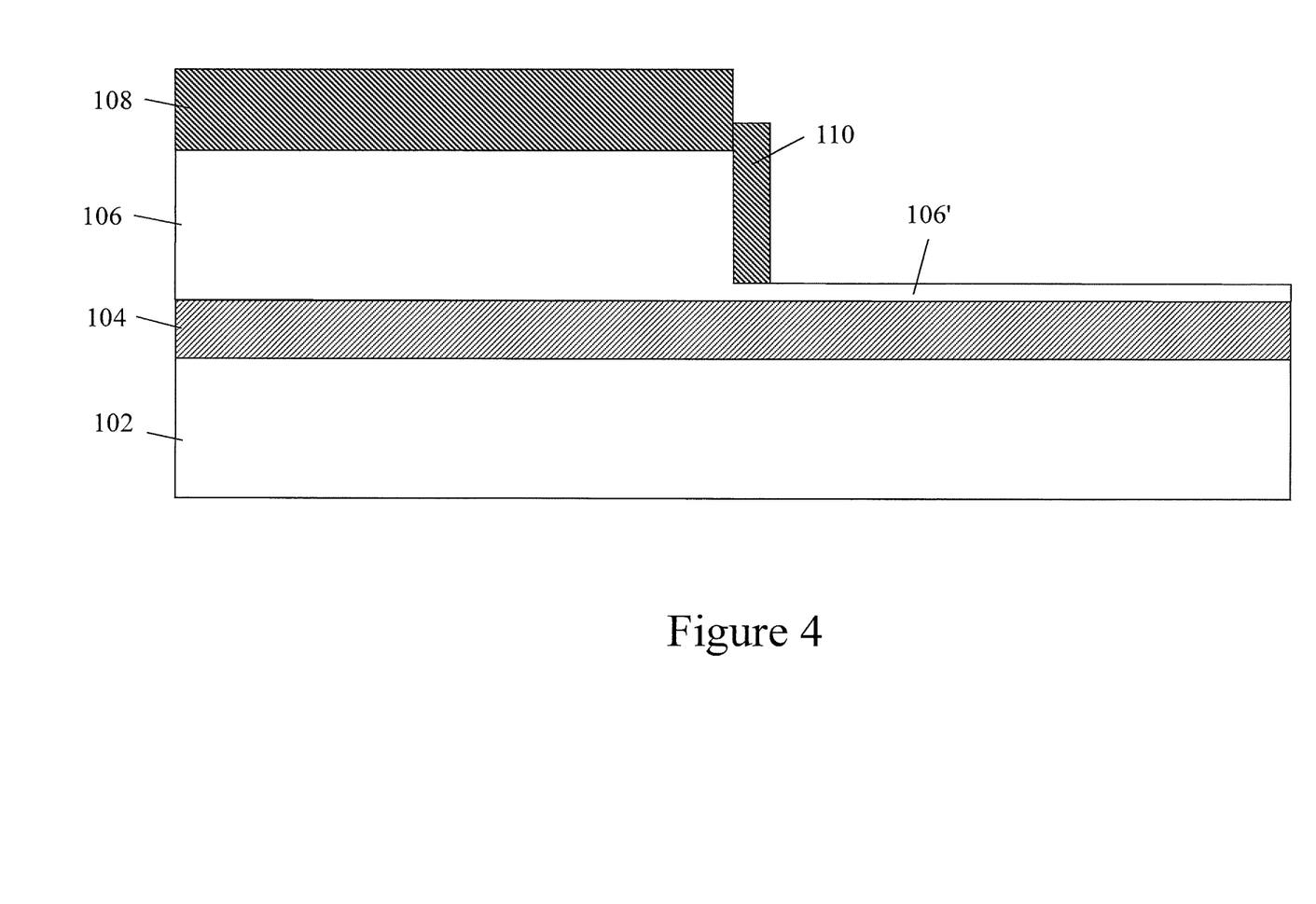
FIG. 4 illustrates an optional spacer formed on an exposed sidewall of the SOI layer.

Optionally, a sidewall spacer 110 (e.g., also a nitride) may be formed on an exposed sidewall of the SOI layer 106, as a result of the recess, as shown in FIG. 4. The sidewall spacer 110 may be formed, for example, by blanket deposition of additional nitride material followed by anisotropic etching to remove horizontal surfaces of the nitride material. It will be noted that such etching will still leave sufficient hardmask material 108 blocking the NFET regions of the device at this point in the processing.

Figure 5:
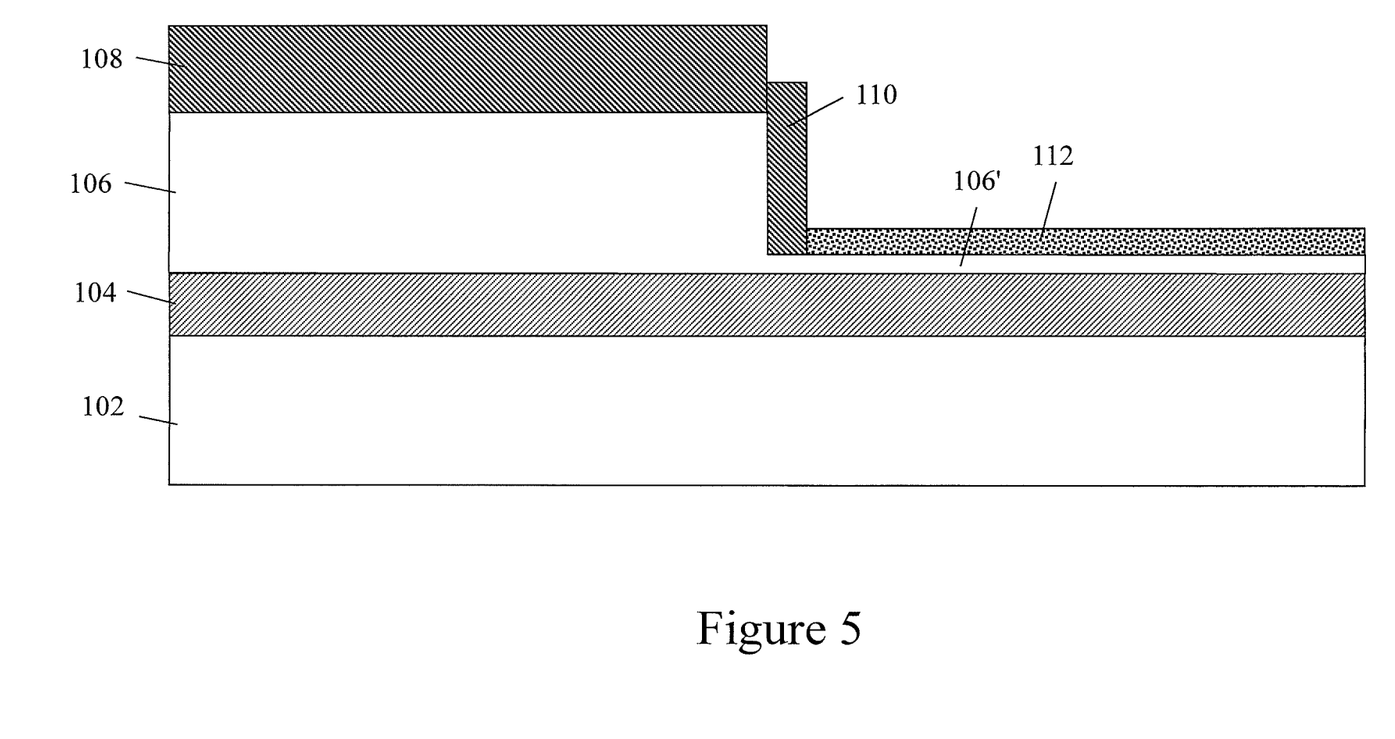
FIG. 5 illustrates the formation of a heavily doped semiconductor layer on the recessed SOI layer.

Referring now to FIG. 5, a heavily doped semiconductor layer 112 is formed on the recessed SOI layer 106'. The heavily doped layer 112 serves as a seed material for dopant atoms that will convert the recessed SOI layer 106' into a sacrificial layer by becoming etch selective with respect to undoped silicon. In an exemplary embodiment, the heavily doped layer 112 is an n-type doped silicon layer that is epitaxially grown on the recessed SOI layer 106' and having an initial dopant concentration on the order of about 1E21-5E21 atoms/cm$^2$, and more particularly about 2E21. Suitable dopant materials in this regard may include arsenic (As) or phosphorous (P). The heavily doped layer 112 may also be formed at thickness similar to that of the recessed SOI layer 106'.

Figure 6:
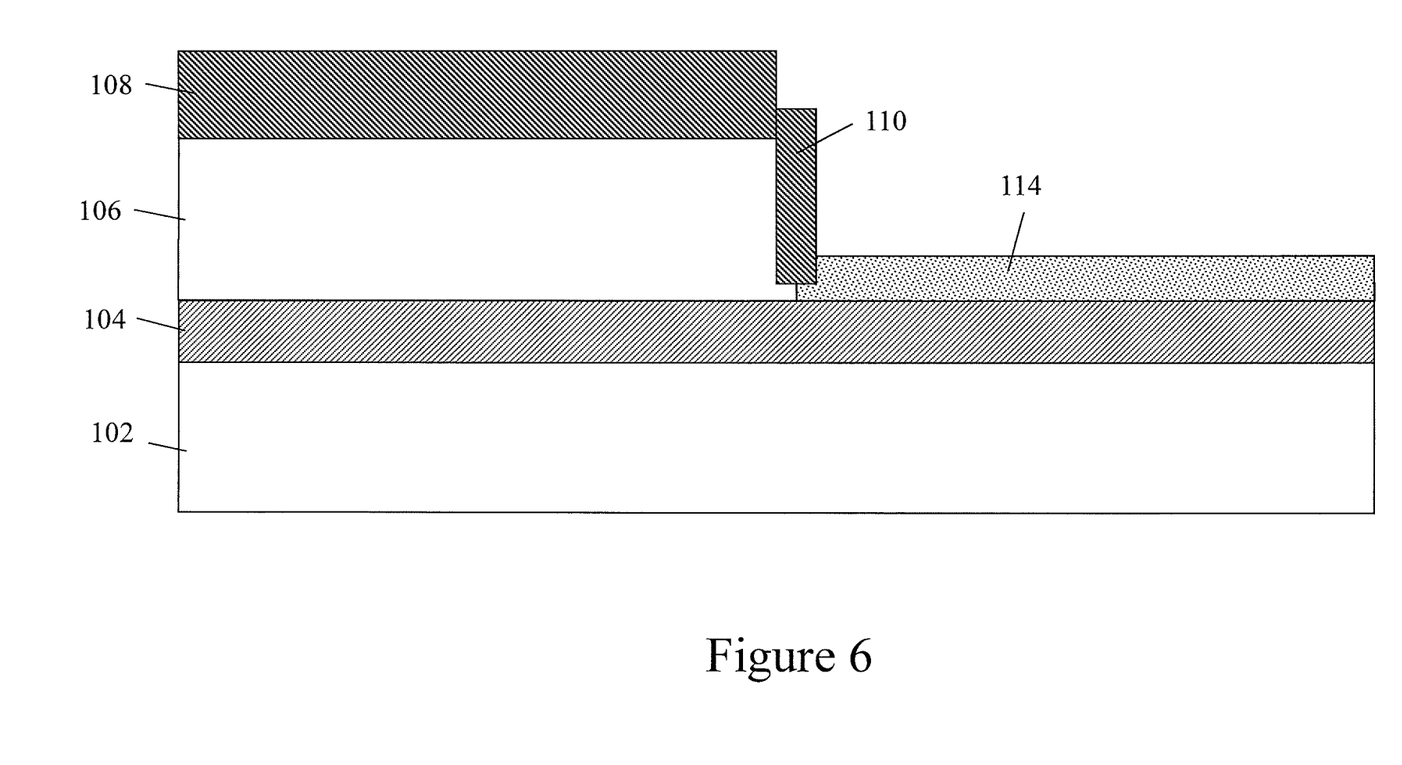
FIG. 6 illustrates an anneal process to distribute the dopant into the recessed SOI layer, to form a sacrificial layer.

As illustrated in FIG. 6, an anneal process is then performed in order to more uniformly distribute the dopant from the heavily doped layer into the recessed SOI layer, thereby forming a sacrificial layer 114. By way of example, where the heavily doped layer 112 of FIG. 5 has a dopant concentration of about 2E21 atoms/cm$^2$, the resulting sacrificial layer 114 post anneal may have a dopant concentration of about 1E21 atoms/cm$^2$. Following the formation of the sacrificial layer 114 in the PFET regions of the substrate, the semiconductor material for PFET fins may then be formed, as shown in FIG. 7.

Figure 7:
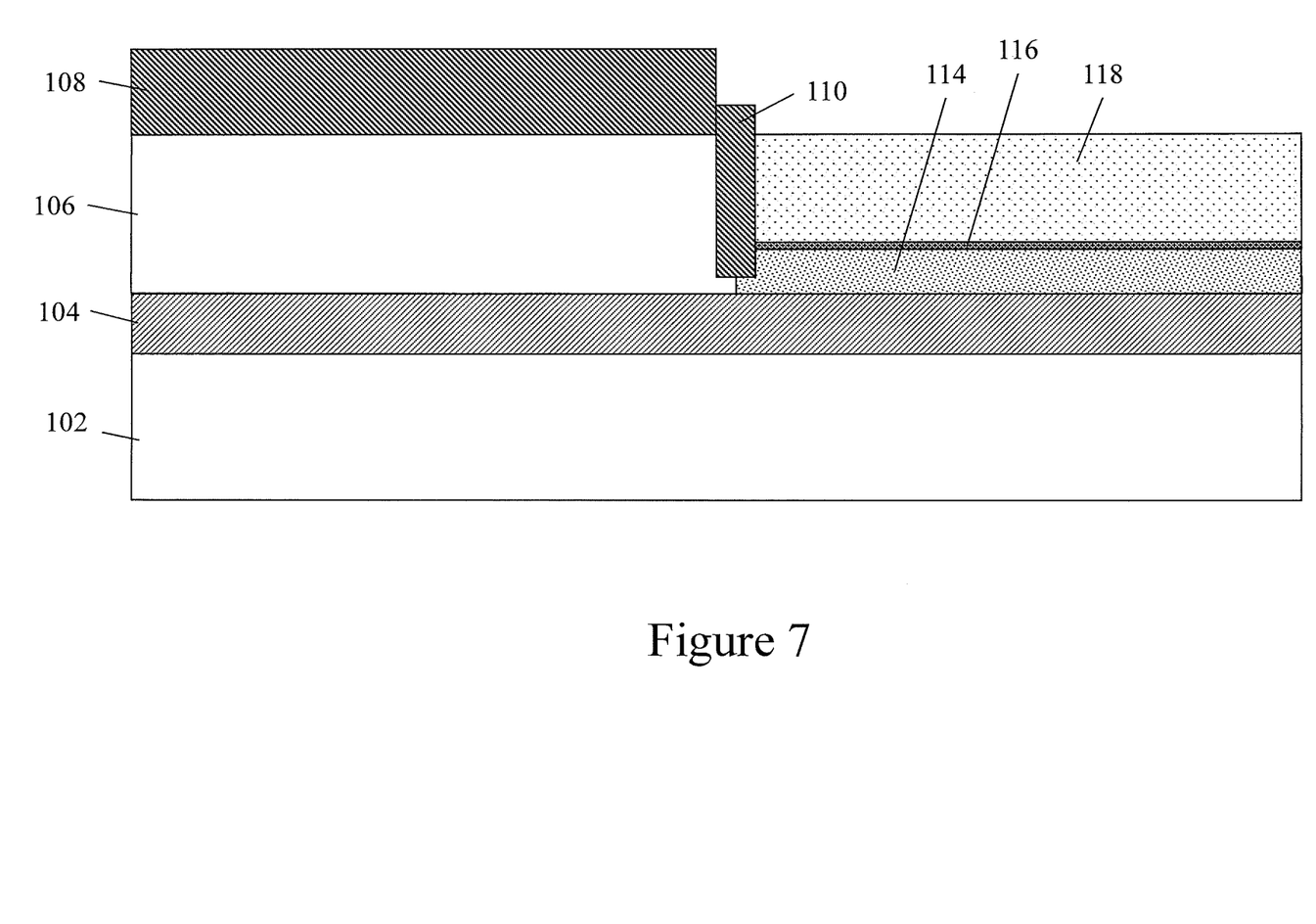
FIG. 7 illustrates the formation of an optional diffusion barrier layer and a silicon germanium layer over the sacrificial layer.

More specifically, FIG. 7 illustrates the formation of an optional diffusion barrier layer 116 on the sacrificial layer 114, and epitaxial silicon germanium (SiGe) layer 118 formed on the optional diffusion barrier layer 116. Where used, the diffusion barrier layer may include a relatively thin (e.g., about 2-5 nm) layer of carbon doped silicon (Si:C), with 0.2% to 1% carbon, for example. The epitaxial SiGe layer 118 has a germanium concentration of about 20%-50% atomic, more specifically about 25% Ge atomic, and is compressively strained due to the lattice mismatch with the underlying sacrificial layer 114 and/or barrier layer 116. As known in the art, compressively strained semiconductor materials enhance hole mobility, which is the dominant carrier in PFET devices. The height (i.e., top surface) of the epitaxial SiGe layer 118 may be roughly equivalent to that of the unetched SOI layer 106 in the NFET regions.

Figure 8:
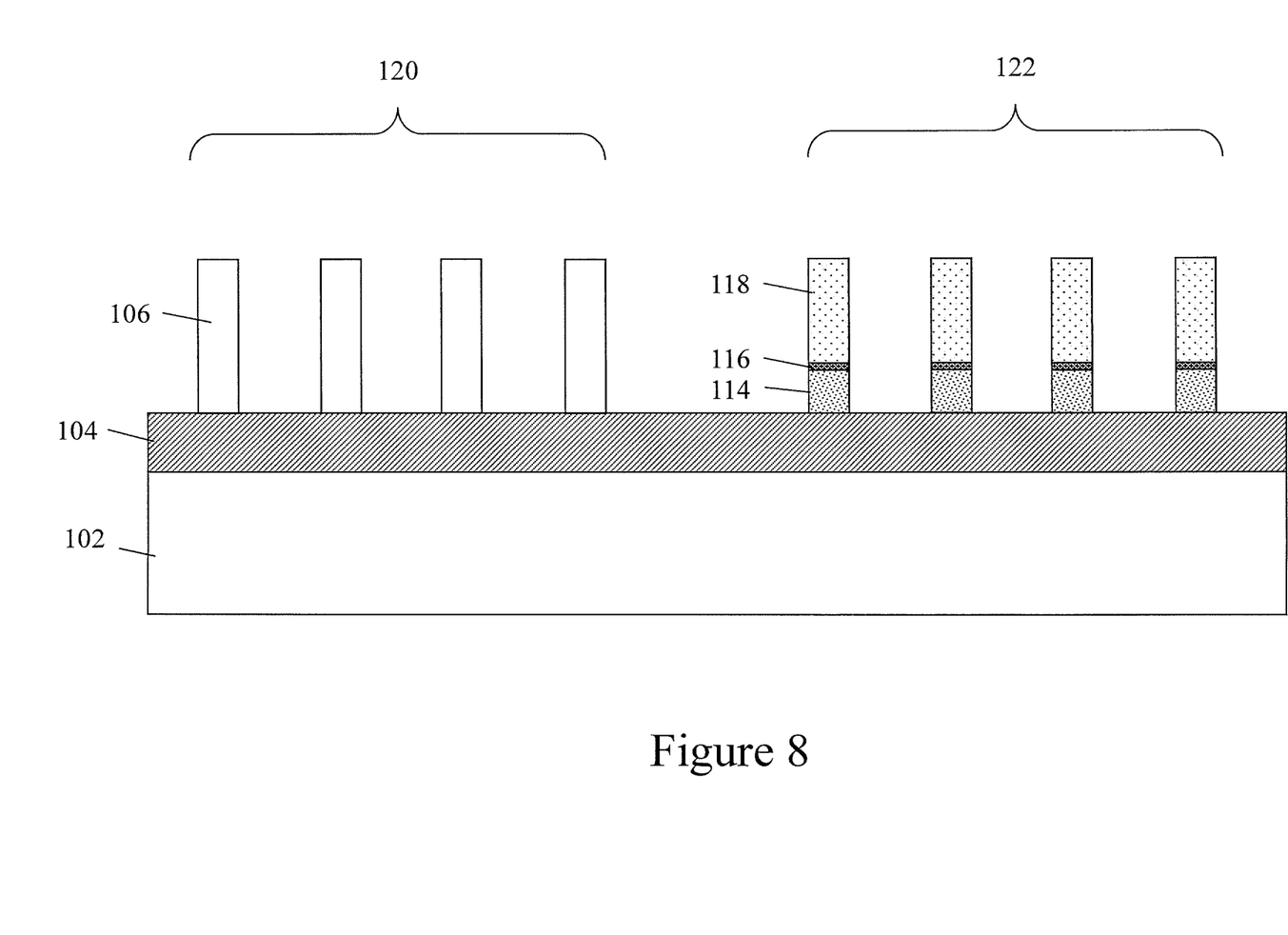
FIG. 8 illustrates the removal of the hardmask layer and the formation of fins in both NFET and PFET regions.

Referring now to FIG. 8, a multistep process is used to define a plurality of NFET fins 120 and a plurality of PFET fins 122. After removing remaining portions of the blocking hardmask 108 (FIG. 7), a suitable fin patterning process (e.g., sidewall image transfer) as known in the art may be used to define the fins. At this stage of processing, the NFET 120 fins include the silicon material from the SOI layer 106, whereas the PFET fins 122 are characterized by a multilayer stack including at least the sacrificial layer 114, optionally the diffusion barrier layer 116, and the SiGe layer 118.

In existing fin strain techniques, the main strain benefits are derived from a high concentration of germanium in the SiGe fin, in addition to enhanced strain in the source/drain regions where the fins are epitaxially merged. However, in the channel region, while there is generally higher strain present at the topmost portions of the fins, there is almost no strain at the bottom portion of the fins, as the fins are conventionally anchored to the BOX layer below. Accordingly, by removing anchoring material in the channel portion of the fins below the gate region, the fins are released from the substrate and as a result, strain in the channel is increased. That is, as opposed to only the upper part of the fin in the channel being strained, strain is introduced throughout the entire height of the fin material present in the channel region.

Figure 9:
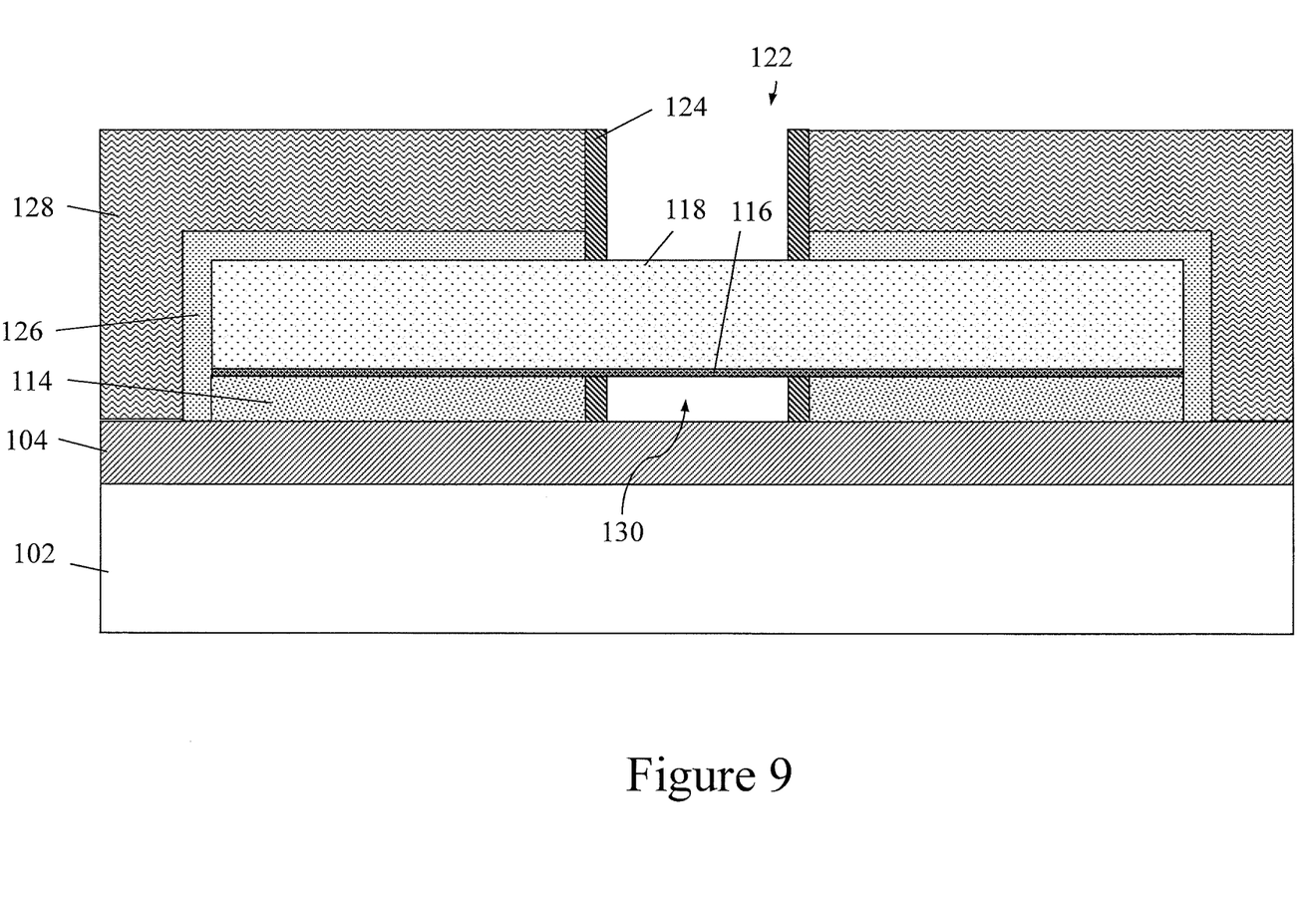
FIG. 9 is a rotated view illustrating the removal of the sacrificial layer beneath a PFET fin in the channel region, following dummy gate spacer formation, source/drain epitaxy, interlevel dielectric (ILD) formation, and dummy gate removal.

To this end, FIG. 9 is a rotated view of one of the PFET fins 122, illustrating the removal of the sacrificial layer 114 fin in the channel region. Prior to the sacrificial layer removal, certain other processes associated with replacement gate formation are first performed, as are known in the art. Since such processes are known to one skilled in the art of FinFET and replacement gate fabrication, they are not described in further detail herein, but include: the formation and patterning of a dummy gate material (already shown removed) and dummy gate spacers 124; the epitaxial merging of the fins 122 in the source/drain regions with additional SiGe material 126 (which may have a higher germanium concentration that the fins 122, e.g., about 35%-80% atomic), the deposition and planarization of an interlevel dielectric (ILD) layer 128 (e.g., a low-k material); and the removal (pull) of the dummy gate material to re-expose the PFET fins 122 in the channel region.

Recalling that the sacrificial material 114 (e.g., As doped silicon) is etch selective with respect to the SiGe fin material 118, a suitable etch process is employed to release (mechanically decouple) the fin 122 from the SOI layer 104 in the channel region, as shown by the cavity 130 in FIG. 9. Again, this has the effect of increasing the compressive strain in the channel. While this selective etch removes the doped Si sacrificial material 114, the optional Si:C diffusion barrier 116 is shown as still remaining in the channel. Alternatively, this portion of the barrier layer 116 could also be removed in the channel region selective to the SiGe material 118.

Figure 10:
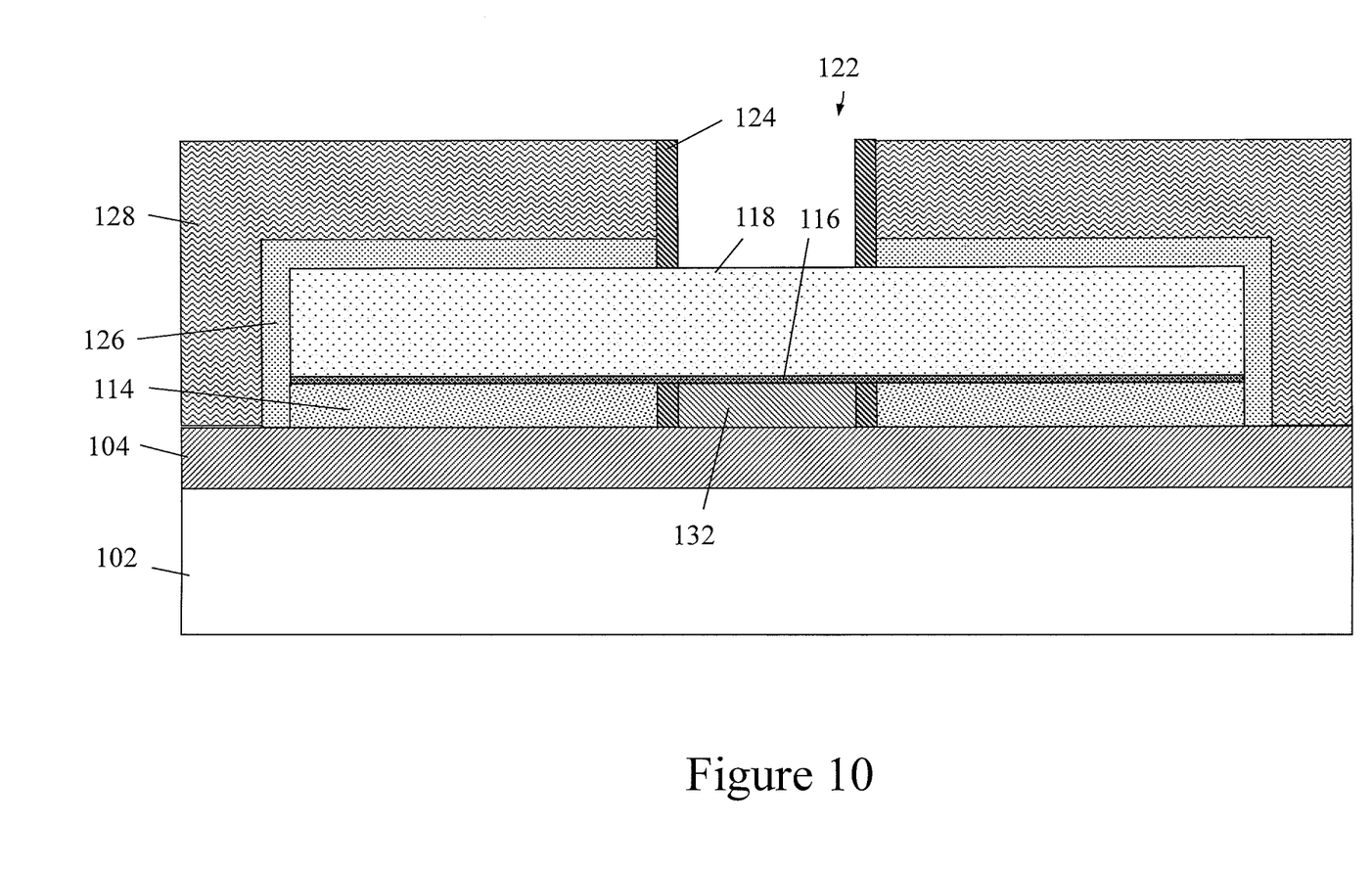
FIG. 10 illustrates an optional process to fill the region below the PFET fin with an insulator or semiconductor material.

From this point, additional replacement gate processes as known in the art may be performed including, for example, forming a high-k gate dielectric layer(s), one or more workfunction metal layers and one or more gate electrode layers. It will be noted that where the void 130 remains unfilled prior to replacement gate formation, the structure may resemble a gate all around structure, similar to that of a nanowire. Alternatively, the void 130 below the PFET fin 122 may be filled with a replacement material 132, such as by depositing and subsequent etching of a dielectric or semiconductor material, as is shown in FIG. 10.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of introducing strain in a channel region of a FinFET device, the method comprising:
   forming a fin structure on a substrate, the fin structure having a lower portion comprising a sacrificial layer and an upper portion comprising a strained semiconductor layer; and
   removing a portion of the sacrificial layer corresponding to a channel region of the FinFET device so as to release the upper portion of the fin structure from the substrate in the channel region;
   wherein forming the fin structure on the substrate further comprises:
   recessing a silicon layer on the substrate to a thickness of about 5-10 nanometers (nm);
   forming a heavily doped layer on the recessed silicon layer, the heavily doped layer comprising an n-type doped silicon layer that is epitaxially grown on the recessed silicon layer and having an initial dopant concentration on the order of about 1E21-5E21 atoms/$cm^2$; and
   performing an anneal to distribute the dopant from the heavily doped layer into the recessed silicon layer, thereby forming the sacrificial layer.

2. The method of claim 1, further comprising forming a diffusion barrier layer on the sacrificial layer and epitaxially growing a strained silicon germanium layer on the diffusion barrier layer.

3. The method of claim 2, wherein the diffusion barrier layer comprises carbon doped silicon (Si:C).

4. The method of claim 3, further comprising replacing the removed portion of the sacrificial layer with a fill material.

5. The method of claim 4, wherein the fill material comprises one of an insulator material and a semiconductor material.

6. The method of claim 2, further comprising epitaxially merging the fin with one or more adjacent fins, at source and drain regions of the fin.

7. The method of claim 6, wherein the fin is epitaxially merged with the one or more adjacent fins using additional silicon germanium, and wherein the additional silicon germanium has at least a same or a greater germanium concentration than the silicon germanium layer of the fin.

8. A method of forming a semiconductor device structure, the method comprising:
   patterning a hardmask layer to block an NFET region of a silicon-on-insulator (SOI) substrate;
   recessing an SOI layer in a PFET region of the SOI substrate;
   doping the recessed layer in the PFET region to form a sacrificial layer having an etch selectivity with respect to the SOI layer;
   forming a compressively strained silicon germanium (SiGe) layer over the sacrificial layer;
   removing the hardmask layer and forming one or more fins in the NFET region and one or more fins in the PFET region, wherein NFET fins comprise the SOI layer, and wherein PFET fins have a lower portion comprising the sacrificial layer and an upper portion comprising the compressively strained SiGe layer; and
   removing a portion of the sacrificial layer corresponding to a channel region of the one or more PFET fins so as to release the upper portion from the SOI substrate in the channel region;
   wherein forming the sacrificial layer further comprises:
   recessing the SOI layer in a PFET region to a thickness of about 5-10 nanometers (nm);
   forming a heavily doped layer on the recessed silicon layer, the heavily doped layer comprising an n-type doped silicon layer that is epitaxially grown on the recessed silicon layer and having an initial dopant concentration on the order of about 1E21-5E21 atoms/cm$^2$; and performing an anneal to distribute the dopant from the heavily doped layer into the recessed SOI layer.

9. The method of claim 8, wherein the sacrificial layer has a dopant concentration of about 1E21 atoms/cm$^2$, and the SiGe layer has a germanium concentration of about 25% Ge atomic.

10. The method of claim 8, further comprising forming a diffusion barrier layer on the sacrificial layer and epitaxially growing the SiGe layer on the diffusion barrier layer.

11. The method of claim 10, wherein the diffusion barrier layer comprises carbon doped silicon (Si:C).

12. The method of claim 11, further comprising replacing the removed portion of the sacrificial layer with a fill material, comprising one of an insulator material and a semiconductor material.

13. The method of claim 2, further comprising epitaxially merging source and drain regions of the PFET fins, using additional silicon germanium, and wherein the additional silicon germanium has at least a same or a greater germanium concentration than the silicon germanium layer of the PFET fins.

* * * * *